US011990737B2

(12) United States Patent
Fujimura et al.

(10) Patent No.: US 11,990,737 B2
(45) Date of Patent: May 21, 2024

(54) ELECTRICAL CONNECTION BOX

(71) Applicants:AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Yuki Fujimura, Mie (JP); Hitoshi Takeda, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 327 days.

(21) Appl. No.: 17/608,005

(22) PCT Filed: Apr. 28, 2020

(86) PCT No.: PCT/JP2020/018089
§ 371 (c)(1),
(2) Date: Nov. 1, 2021

(87) PCT Pub. No.: WO2020/230622
PCT Pub. Date: Nov. 19, 2020

(65) Prior Publication Data
US 2022/0255304 A1    Aug. 11, 2022

(30) Foreign Application Priority Data

May 15, 2019   (JP) .................................. 2019-091923

(51) Int. Cl.
*H02G 3/16*       (2006.01)
*B60R 16/02*     (2006.01)
(Continued)

(52) U.S. Cl.
CPC .................. *H02G 3/16* (2013.01); *H05K 5/06* (2013.01); *H05K 7/06* (2013.01); *B60R 16/02* (2013.01)

(58) Field of Classification Search
CPC .......... B60R 16/02; H02G 3/16; H02G 3/088; H02G 15/113; H05K 5/06; H05K 5/0217;
(Continued)

(56) References Cited

U.S. PATENT DOCUMENTS

| 9,768,600 B1 * | 9/2017 | Kato | H02G 15/113 |
|---|---|---|---|
| 11,070,009 B2 * | 7/2021 | Lee | H01H 85/205 |
| 2017/0196110 A1 * | 7/2017 | Shinn | F16J 15/022 |

FOREIGN PATENT DOCUMENTS

| JP | 07-027235 | 5/1995 |
|---|---|---|
| JP | 2000-036678 | 2/2000 |

(Continued)

OTHER PUBLICATIONS

International Search Report issued in International Bureau of WIPO Patent Application No. PCT/JP2020/018089, dated Jul. 14, 2020, along with an English translation thereof.

*Primary Examiner* — Hoa C Nguyen
*Assistant Examiner* — Amol H Patel
(74) *Attorney, Agent, or Firm* — Greenblum & Bernstein, P.L.C.

(57) ABSTRACT

An electrical connection box includes a case; a power supply circuit; and a branch circuit, wherein the branch circuit includes a detachable overcurrent protection element and branches from the power supply circuit; the case includes a case body, a cover detachably attached to the case body, and a cover sealing member having elasticity; the case body includes a first working hole and houses the power supply circuit and the branch circuit; the first working hole is formed at a position that allows the overcurrent protection element to face outward and is formed with external shape
(Continued)

dimensions smaller than external shape dimensions of a ceiling plate; the cover is installed on the case body such that the first working hole is closed; and the cover sealing member is brought into close contact with a peripheral edge portion of the first working hole of the case body and the cover.

11 Claims, 14 Drawing Sheets

(51) Int. Cl.
    *H02G 3/08*     (2006.01)
    *H02G 15/113*     (2006.01)
    *H05K 5/06*     (2006.01)
    *H05K 7/06*     (2006.01)

(58) Field of Classification Search
    CPC ........ H05K 5/0247; H05K 5/03; H05K 5/061; H05K 7/06
    See application file for complete search history.

(56) References Cited

FOREIGN PATENT DOCUMENTS

| JP | 2007-325465 | 12/2007 |
| JP | 2007-330054 | 12/2007 |
| JP | 2009-112078 | 5/2009 |
| JP | 2019-047535 | 3/2019 |

\* cited by examiner

ELECTRICAL CONNECTION BOX

TECHNICAL FIELD

The present disclosure relates to an electrical connection box.

BACKGROUND ART

A known electrical connection box for a vehicle is described in JP 2019-47535A, for example.

This electrical connection box includes an upper case and a lower case vertically assembled. In an upper portion of the lower case, a multilayer bus bar connected to a power supply circuit, a relay bus bar connected to the multilayer bus bar, a power distribution board, a fuse, and the like are installed. The power distribution board is connected to the relay bus bar via the fuse to form a branch circuit branching from the power supply circuit.

CITATION LIST

Patent Documents

Patent Document 1: JP 2019-47535A

SUMMARY OF INVENTION

Technical Problem

With the electrical connection box described above, to replace the fuse, the upper case is removed from the lower case and the entire upper portion of the lower case is exposed.

However, in a case where the fuse is replaced by exposing the entire upper portion of the lower case, the region between the lower case and the upper case that needs to be waterproof is increased in size, making water entering between the lower case and the upper case more likely. As a result, the waterproofness of the electrical connection box is decreased.

In the present specification, technology for making replacement work easier and increasing waterproofness is described.

Solution to Problem

An electrical connection box of the present disclosure includes:
a case;
a power supply circuit; and
a branch circuit, wherein
the branch circuit is a circuit that includes a detachable overcurrent protection element and branches from the power supply circuit;
the case includes a case body, a cover detachably attached to the case body, and a cover sealing member having elasticity;
the case body includes a first working hole and houses the power supply circuit and the branch circuit;
the first working hole extends through a ceiling plate of the case body at a position that allows the overcurrent protection element to face outward and is formed with external shape dimensions smaller than external shape dimensions of the ceiling plate;
the cover is installed on the case body in a manner such that the first working hole is closed; and
the cover sealing member is brought into close contact with a peripheral edge portion of the first working hole of the case body and the cover.

Advantageous Effects of Invention

According to the present disclosure, replacement work can be made easier and waterproofness can be increased.

DESCRIPTION OF EMBODIMENTS

Description of Embodiments of Present Disclosure

Figure 1:
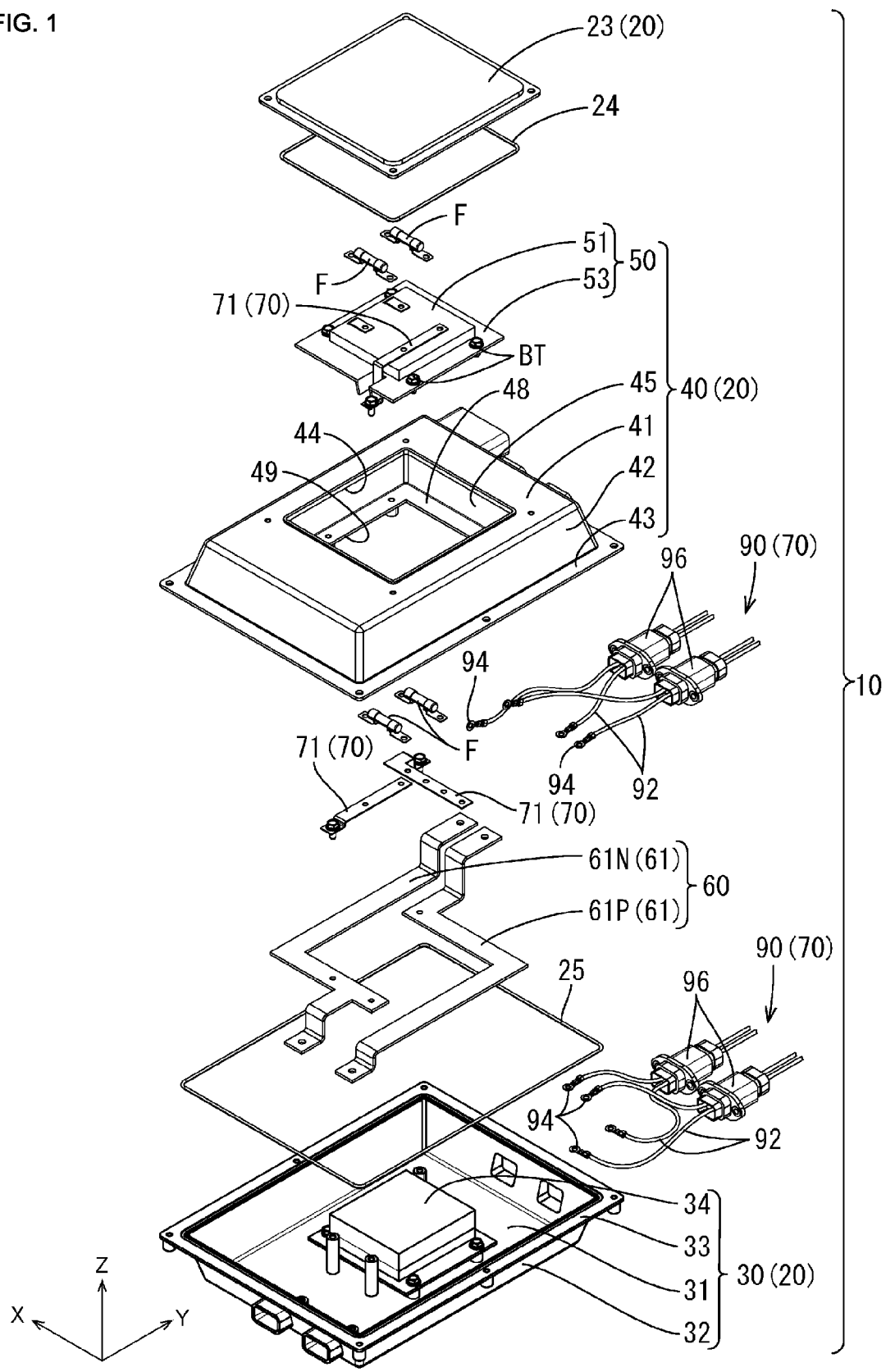
FIG. 1 is an exploded perspective view of an electrical connection box according to an embodiment.

Firstly, embodiments of the present disclosure will be listed and described.

1. An electrical connection box includes:
a case;
a power supply circuit; and
a branch circuit, wherein
the branch circuit is a circuit that includes a detachable overcurrent protection element and branches from the power supply circuit;
the case includes a case body, a cover detachably attached to the case body, and a cover sealing member having elasticity;
the case body includes a first working hole and houses the power supply circuit and the branch circuit;
the first working hole extends through a ceiling plate of the case body at a position that allows the overcurrent protection element to face outward and is formed with external shape dimensions smaller than external shape dimensions of the ceiling plate;
the cover is installed on the case body in a manner such that the first working hole is closed; and the cover sealing member is brought into close contact with a peripheral edge portion of the first working hole of the case body and the cover.

Because the overcurrent protection element faces outward through the first working hole when the cover is removed from the case body, the overcurrent protection element can be easily replaced utilizing the first working hole. In this manner, the work to replace the overcurrent protection element is made easier. Also, when the cover is installed on the case body with the first working hole being formed with external shape dimensions smaller than the external shape dimensions of the ceiling plate of the case body, the first working hole is closed liquid-tight via the cover and the cover sealing member. Accordingly, compared to an example in which the case opens widely making the region that needs to be waterproof large, the waterproofness of the electrical connection box can be increased.

2. The case body includes a lower case, an upper case, and a case sealing member having elasticity;
the lower case and the upper case are configured to be assembled together; the case sealing member is configured to come into close contact with the lower case and the upper case and form a watertight seal between the lower case and the upper case;
the branch circuit includes a lower branch circuit disposed in the lower case and an upper branch circuit disposed in the upper case;
the lower case includes at least one connector connected to the lower branch circuit;
the upper case includes at least one connector connected to the upper branch circuit; and
the lower branch circuit and the upper branch circuit are disposed next to one another in a direction in which the lower case and the upper case are assembled together.

For example, in a case where a connector connected to a branch circuit is provided in both the lower case and the upper case, connecting a branch circuit disposed in the lower case and the connector provided in the upper case via an electrical wire is a plausible method. However, with this method, an area for disposing the upper case needs to be ensured with space provided just for providing the connector. This makes the size of the electrical connection box be made larger. Also, though the electrical connection box is made large, dead space is formed in the upper case.

However, with the configuration described above, the lower branch circuit that connects to the connector of the lower case is disposed in the lower case, and the upper branch circuit that connects to the connector of the upper case is disposed in the upper case. In other words, by effectively utilizing the waterproof inside of the case body, the case body can have a smaller size, allowing for the electrical connection box to have a smaller size.

3. The power supply circuit is disposed in the lower case; and the upper branch circuit includes a branch bus bar connected to the power supply circuit.

For example, an electrical connection box in which an electrical wire of an upper branch circuit is connected to a power supply circuit disposed in the lower case must include a surplus length housing region in the case for housing the surplus length of the electrical wire for when assembling the lower case and the upper case together. Thus, the size of the case is increased by the size needed for the surplus length housing region.

However, because the upper branch circuit includes the branch bus bar that connects to the power supply circuit, there is no need to include a surplus length housing region in the case for when assembling the lower case and the upper case, allowing the case to have a smaller size. Accordingly, the electrical connection box can further have a smaller size.

4. The upper case includes an upper base where the overcurrent protection element of the upper branch circuit is disposed;
the lower case includes a lower base where the overcurrent protection element of the lower branch circuit is disposed; and
the upper base and the lower base are disposed next to one another in the direction in which the lower case and the upper case are assembled together.

Compare to an example in which an upper base and a lower base are disposed offset from one another in a direction that intersects the direction in which the lower case and the upper case are assembled together, this electrical connection box does not need to be increased in size in the intersecting direction.

5. The upper case includes a base receiving portion from which the upper base is able to be detached; and the base receiving portion includes a second working hole closed by the upper base.

The lower base can be made to face outward through the first working hole and the second working hole by removing the upper base from the base receiving portion. In other words, the overcurrent protection element disposed in the lower base can be replaced utilizing the first working hole and the second working hole. In this manner, compared to an example in which the entire circuit including the power supply circuit is exposed to replace the overcurrent protection element, the waterproofness can be increased, and the work to replace the overcurrent protection element can be made easier.

6. The branch bus bar is able to be connected to the power supply circuit via the first working hole and the second working hole.

For example, when connecting a bus bar of an upper branch circuit to a power supply circuit when assembling a lower case and an upper case together, depending on the case, the connection state of the bus bar and the power supply circuit cannot be visually confirmed, for example. For such examples, the work to connect the upper branch circuit and the power supply circuit is made difficult.

However, with the present embodiment, because the branch bus bar can be detached from the power supply circuit utilizing the first working hole and the second working hole, for example, when the lower case and the upper case are assembled together, the work to connect the power supply circuit and the upper branch circuit is made very easy compared to an example in which the bus bar of the upper branch circuit is connected to the power supply circuit.

Description of Embodiments of Present Disclosure

A specific example of an electrical connection box according to the present disclosure will be described with reference to the attached drawings. Note that the present disclosure is not limited to these examples and is defined by the scope of the claims, and all modifications that are equivalent to or within the scope of the claims are included.

Embodiment

An embodiment according to the present disclosure will be described with reference to FIGS. 1 to 14.

The present embodiment is an example of an electrical connection box capable of being attached inside a battery pack installed in a vehicle. Hereinafter, the direction indicated by an arrow Z is up, the direction indicated by an arrow Y is to the back, and the direction indicated by arrow X is right. Also, for members including a plurality of members, a reference sign or number may only be given to one of the members of the plurality and not given to other members.

Electrical Connection Box 10

Figure 2:
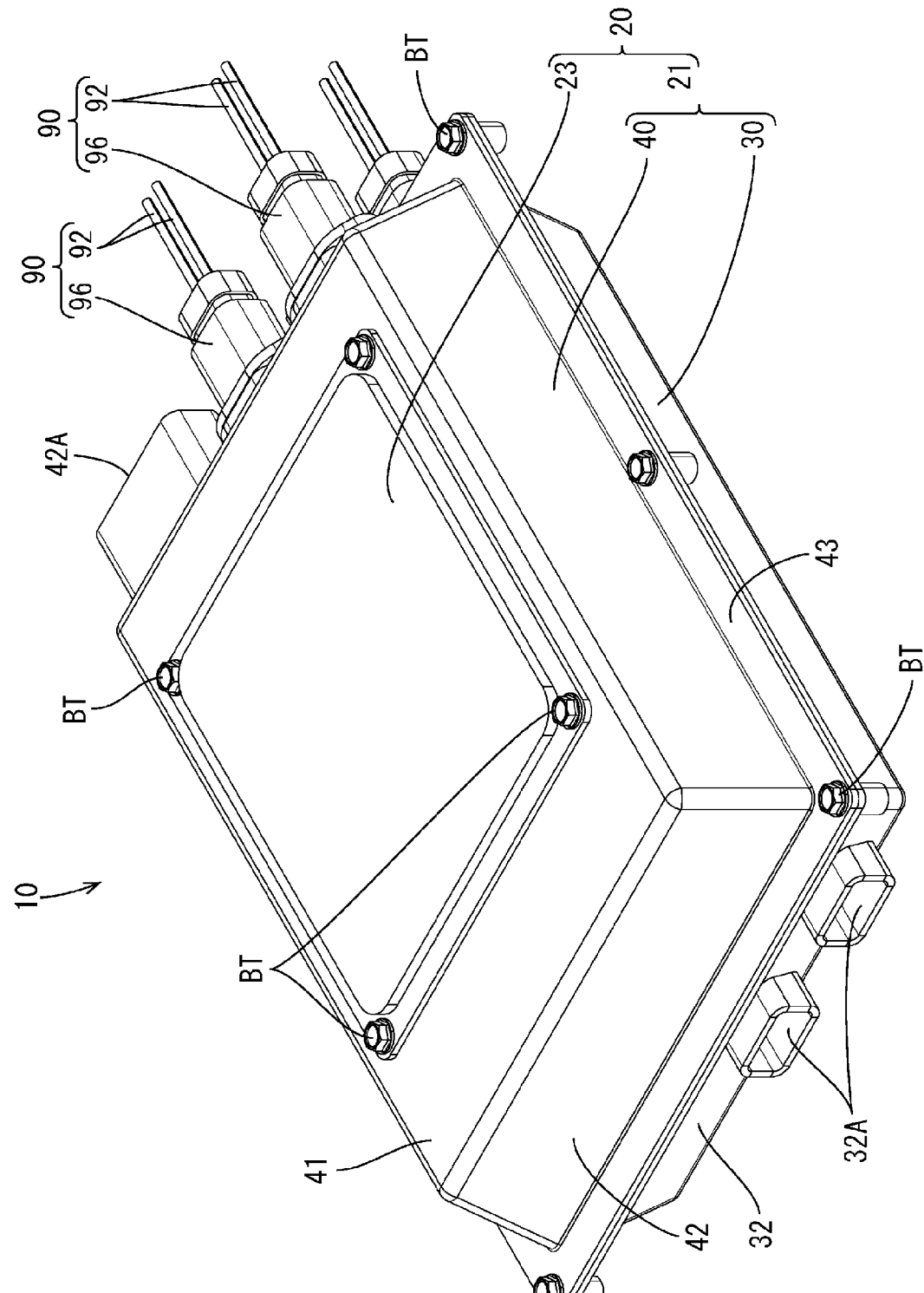
FIG. 2 is a perspective view of the electrical connection box.

As illustrated in FIGS. 1 and 2, an electrical connection box 10 is provided with a case 20, a pair of power supply bus bars 61, a plurality of branch bus bars 71, a plurality of fuses (an example of an overcurrent protection element) F, and a plurality of wire harnesses 90.

Case 20

The case 20 is formed using a synthetic resin with insulating properties. As illustrated in FIGS. 1 to 4, the case 20 is provided with a case body 21, a cover 23, and a cover sealing member 24.

Case Body 21

The case body 21 is formed is a flat box-like shape elongated in the front-and-back direction. The case body 21 is provided with a lower case 30, an upper case 40, and a case sealing member 25.

Lower Case 30

Figure 5:
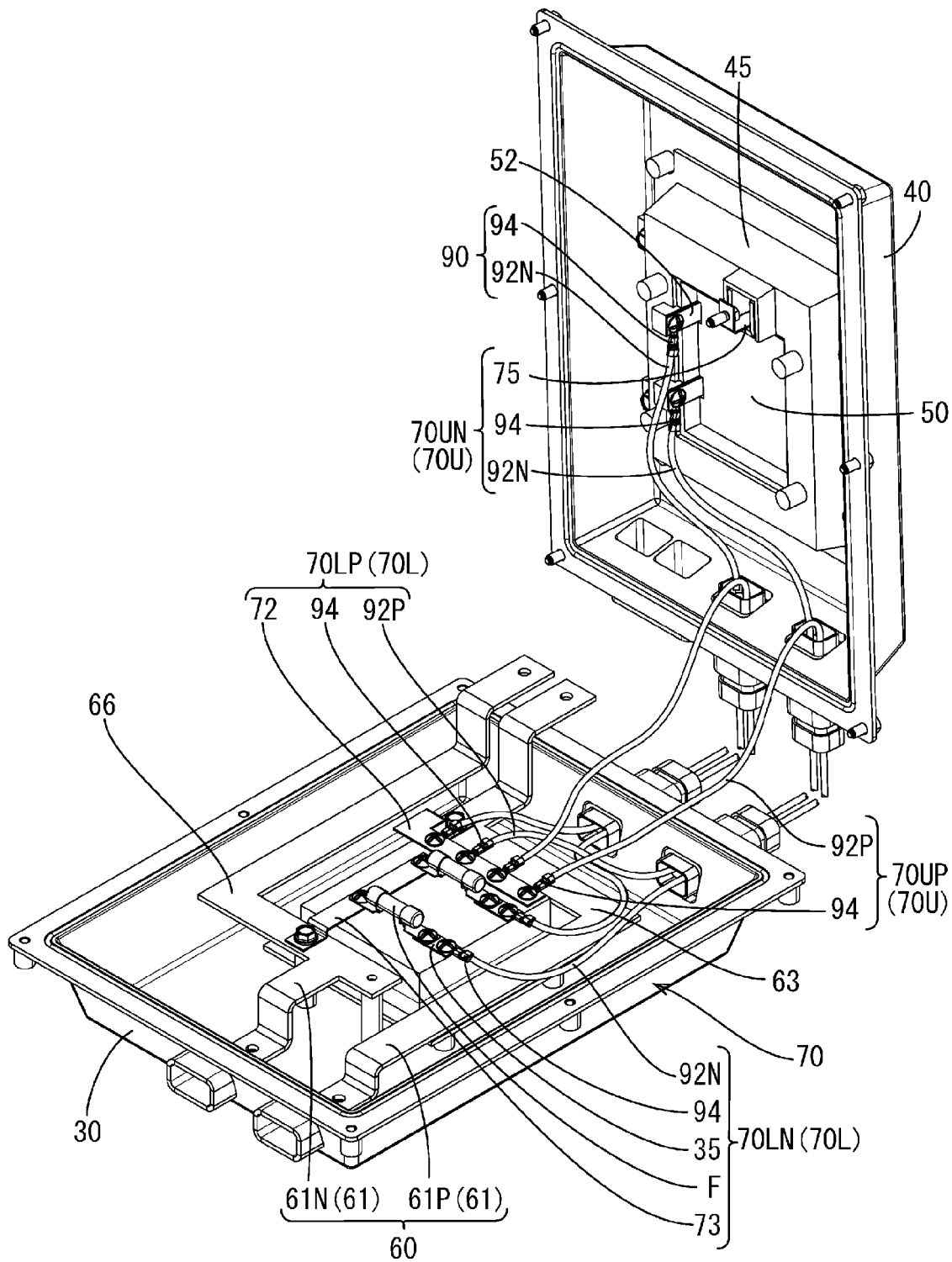
FIG. 5 is a perspective view of a state before a lower case and an upper case are assembled.
Figure 6:
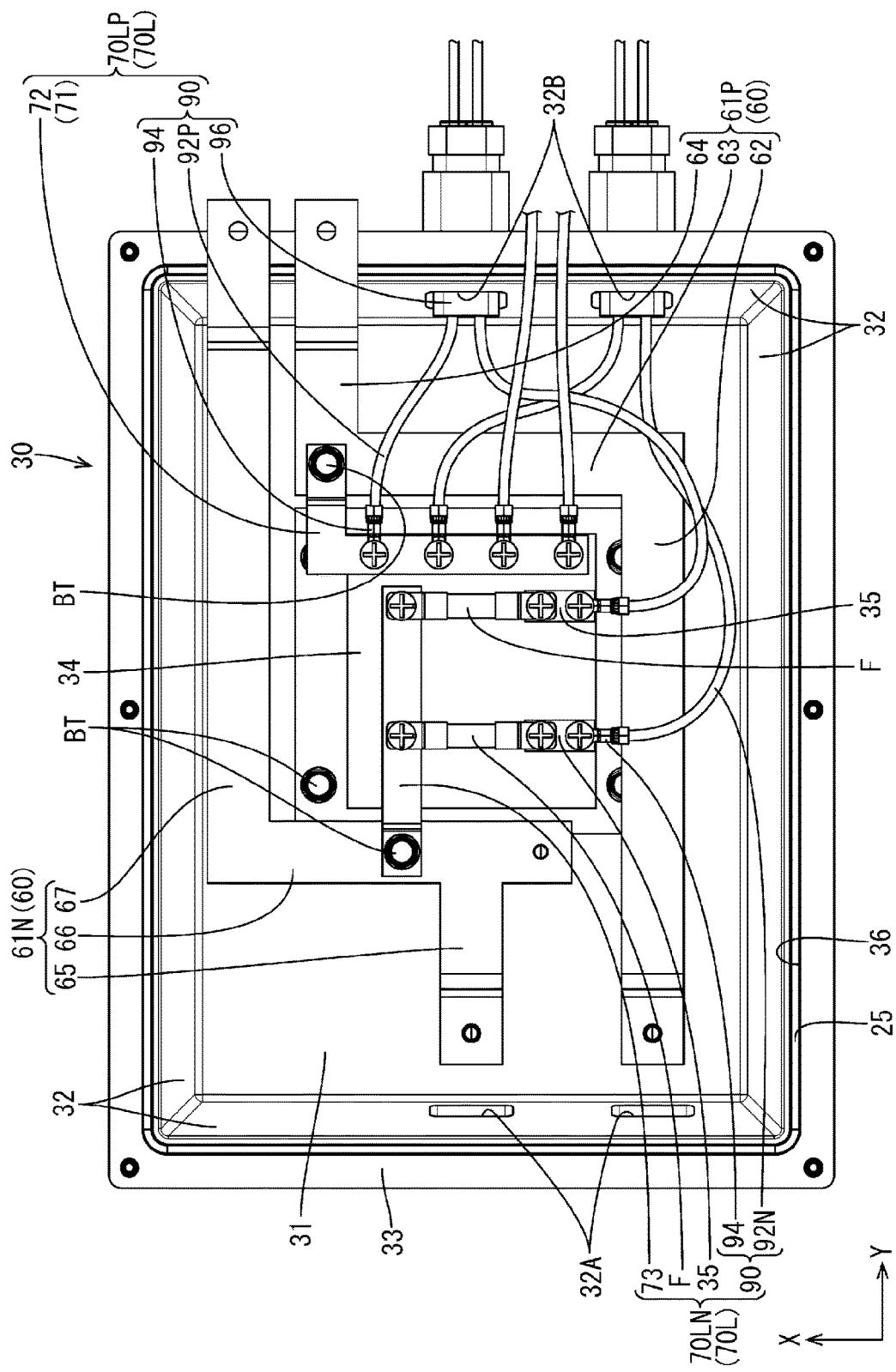
FIG. 6 is a plan view of the lower case with a power supply circuit and a lower branch circuit housed therein.

As illustrated in FIGS. 1, 5, and 6, the lower case 30 is formed in a tray-like shape elongated in the front-and-back direction with an upward-facing opening. The upper case 40 described below is attached to the lower case 30 from above to form the case body 21. The lower case 30 is provided with a bottom plate 31, four lower side plates 32, and a lower flange portion 33.

The bottom plate 31 is formed in a rectangular shape elongated in the front-and-back direction. A lower base 34 with a rectangular shape in a plan view is fixed in the central region of the bottom plate 31 via a bolt BT.

The lower base 34 is formed in a convex-like shape projecting upward. As illustrated in FIG. 6, on the lower base 34, a positive electrode branch bus bar 72 and a first negative electrode branch bus bar 73, described below, of the plurality of branch bus bars 71, a pair of first relay bus bars 35, and two fuses F are placed. The pair of first relay bus bars 35 are fixed on the left end portion of the lower base 34, arranged side by side in the front-and-back direction and extending in the front-and-back direction. For both of the first relay bus bars 35, the left end portion is connected to one of the wire harnesses 90 and the right end portion is connected to one of the fuses F.

The four lower side plates 32 are formed extending upward from the outer side edges of the bottom plate 31.

Adjacent lower side plates 32 are contiguous at the side edges. Thus, the lower case 30 is formed in a tray-like shape, and a power supply circuit 60 and a branch circuit 70, described below, can be housed in the lower case 30 from above.

In the lower side plate 32 on the front side, from among the four lower side plates 32, a pair of front cable entry openings 32A are formed extending through the lower side plate 32 in the front-and-back direction. A non-illustrated power supply cable is able to be inserted in the front cable entry openings 32A in a waterproof state.

In the lower side plate 32 on the back side, from among the four lower side plates 32, a pair of connector attachment openings 32B are formed extending through the lower side plate 32. In the pair of connector attachment openings 32B, two wire harnesses 90, from among the plurality of wire harnesses 90, are attached in a waterproof state.

The lower flange portion 33 is formed along the upper edges of the four lower side plates 32. The lower flange portion 33 is formed in a rectangular shape along the upper edges of the four lower side plates 32 extending outward from the lower side plates 32. A rectangular sealing groove 36 is formed recessed in the upper surface of the lower flange portion 33 conforming to the shape of the lower flange portion 33. The case sealing member 25 with elasticity is installed in the sealing groove 36 from above.

Case Sealing Member 25

The case sealing member 25 is an elastic member made of rubber or the like formed in a rectangular ring-like shape. The case sealing member 25 is installed in the sealing groove 36 with its upper end portion projecting upward from the sealing groove 36. When the upper case 40 is attached to the lower case 30 from above, the case sealing member 25 comes into close contact with the lower flange portion 33 of the lower case 30 and an upper flange portion 43 of the upper case 40 around the entire periphery. In other words, the case sealing member 25 forms a watertight seal between the lower case 30 and the upper case 40, preventing water or the like from entering through the space between the lower case 30 and the upper case 40.

Upper Case 40

As illustrated in FIGS. 1, 5, and 7 to 10, the upper case 40 is formed in a tray-like shape elongated in the front-and-back direction with a downward-facing opening. The upper case 40 is provided with a ceiling plate 41, four upper side plates 42, and the upper flange portion 43.

The ceiling plate 41 is formed in a rectangular shape elongated in the front-and-back direction. The ceiling plate 41 includes a first working hole 44 with a rectangular shape in a plan view. The first working hole 44 is a central portion of the ceiling plate 41 in the left-and-right direction formed in the central portion of the ceiling plate 41 in the front-and-back direction. The width dimension of the first working hole 44 in the left-and-right direction is less than the width dimension of the ceiling plate 41, and the length dimension of the first working hole 44 in the front-and-back direction is less than the length dimension of the ceiling plate 41. In other words, the first working hole 44 is formed with external shape dimensions smaller than the external shape dimensions of the ceiling plate 41 in the upper case 40.

Figure 8:
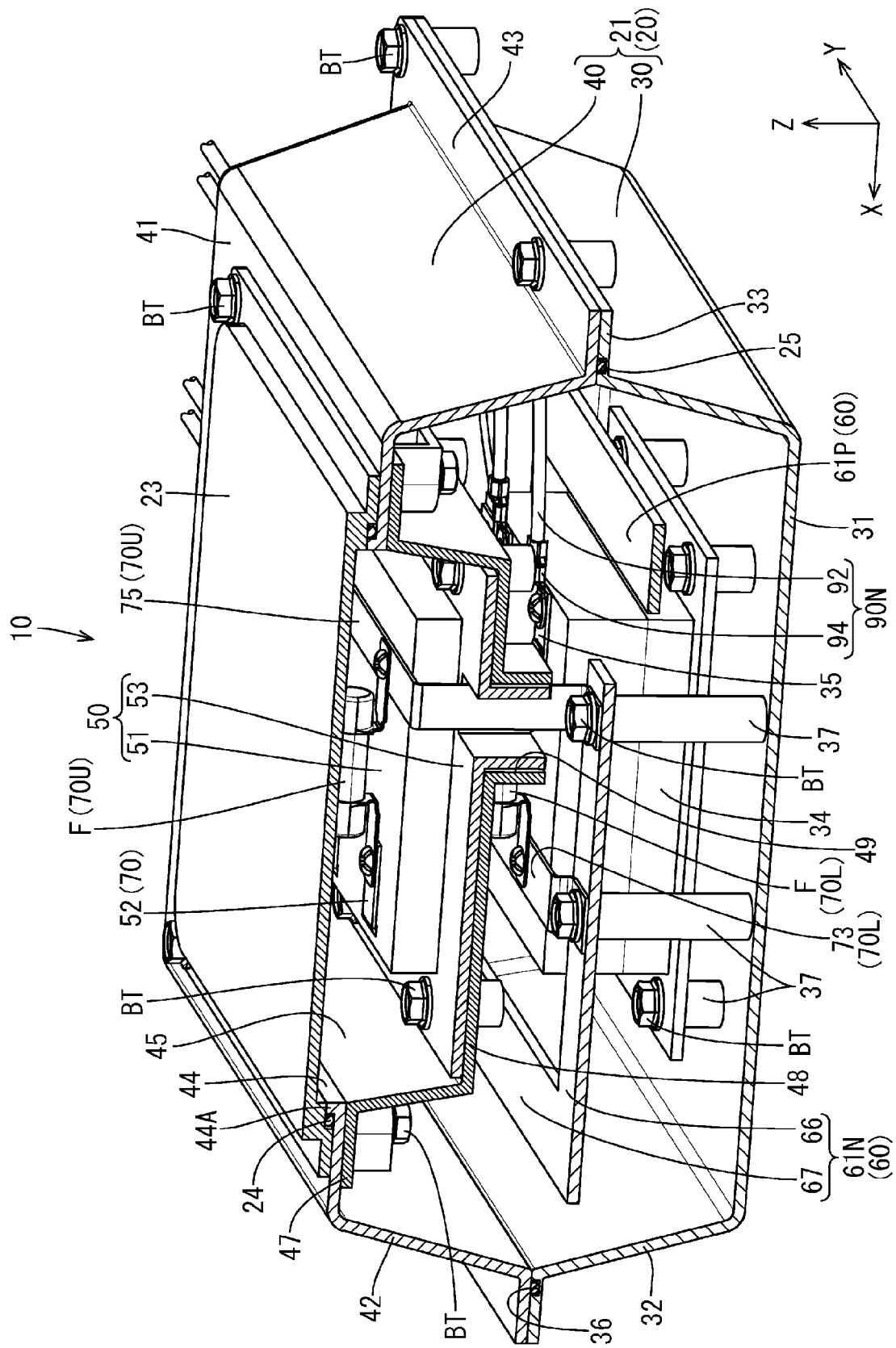
FIG. 8 is a perspective cross-sectional view taken along line A-A of FIG. 3.
Figure 9:
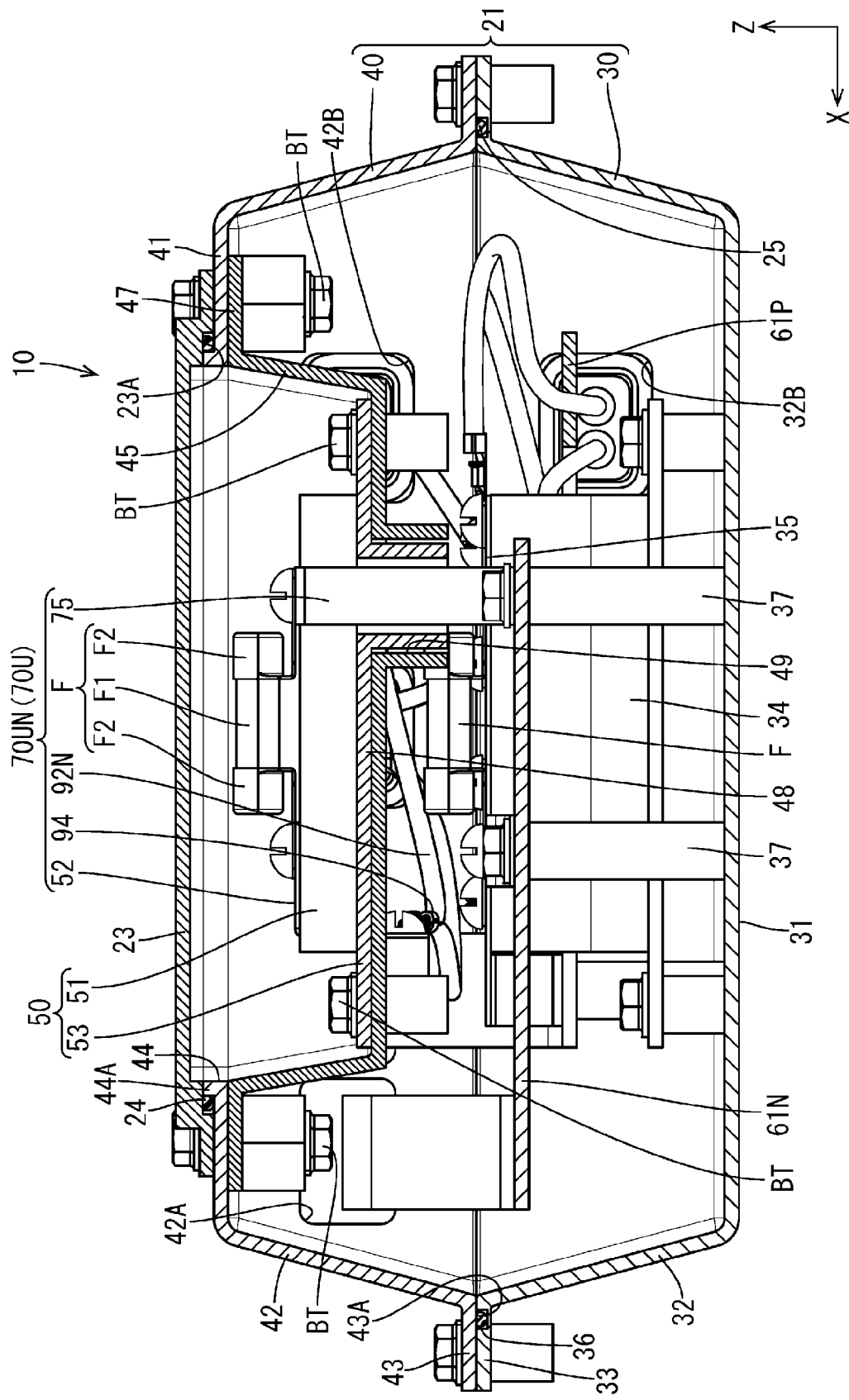
FIG. 9 is a cross-sectional view taken along line A-A of FIG. 3.
Figure 10:
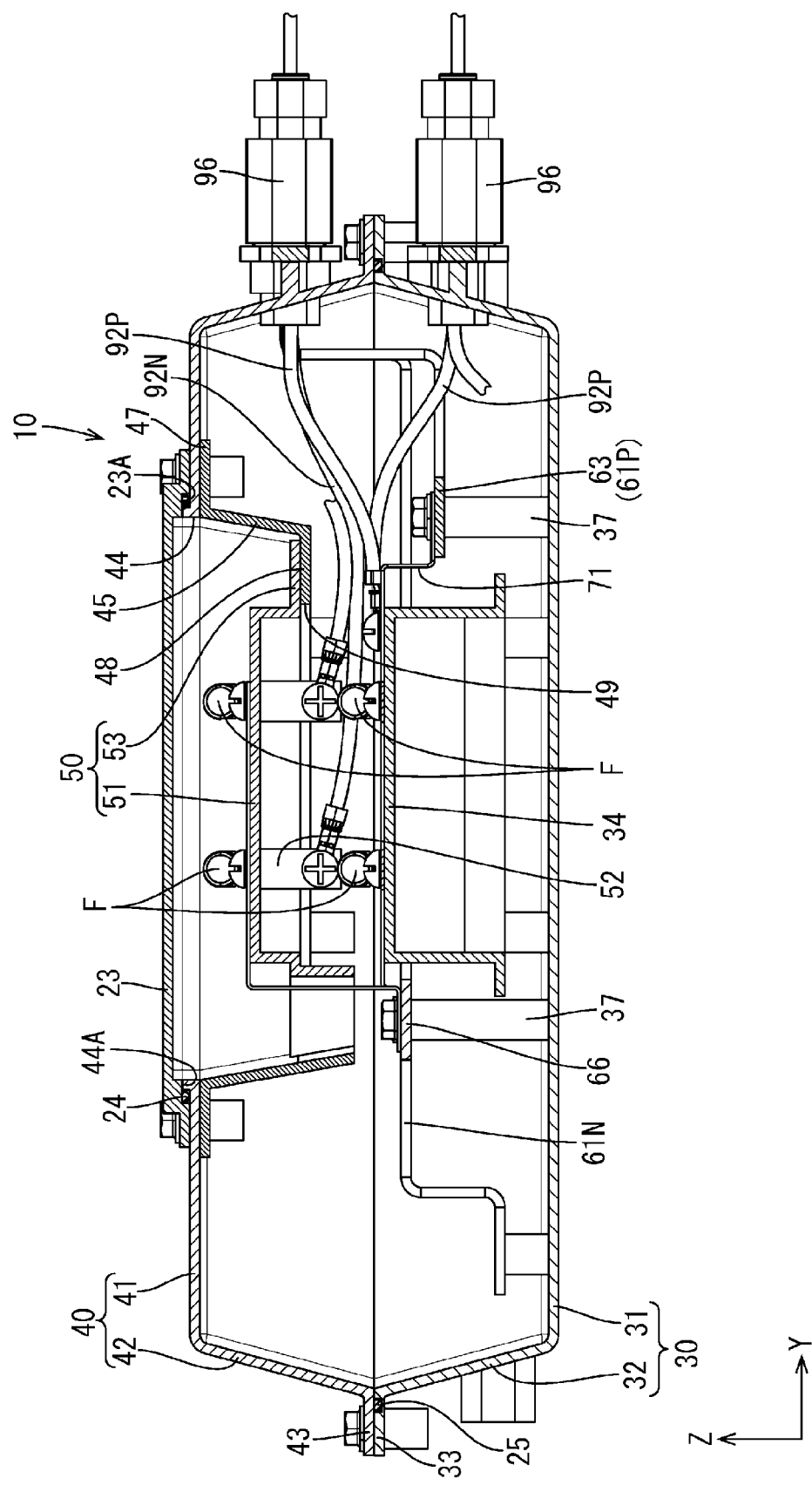
FIG. 10 is a cross-sectional view taken along line B-B of FIG. 3.

As illustrated in FIGS. 8 to 10, a rectangular seal installation rib 44A is formed as a projection on the peripheral edge portion of the first working hole 44 on the upper surface of the ceiling plate 41, the seal installation rib 44A conforming to the shape of the first working hole 44. On the seal installation rib 44A, the cover sealing member 24 described below is installed conforming to the peripheral surface of the seal installation rib 44A.

Also, as illustrated in FIGS. 8 to 12, the upper case 40 includes a base receiving portion 45 configured to be attached to the inner side (lower surface) of the ceiling plate 41.

The base receiving portion 45 is formed in a recess-like shape projecting downward from the lower surface of the ceiling plate 41. The base receiving portion 45 includes an attachment flange 47 extending along the ceiling plate 41. The base receiving portion 45 is fixed to the lower surface of the ceiling plate 41 by the attachment flange 47 being fixed to the ceiling plate 41 from below via a bolt BT.

Figure 11:
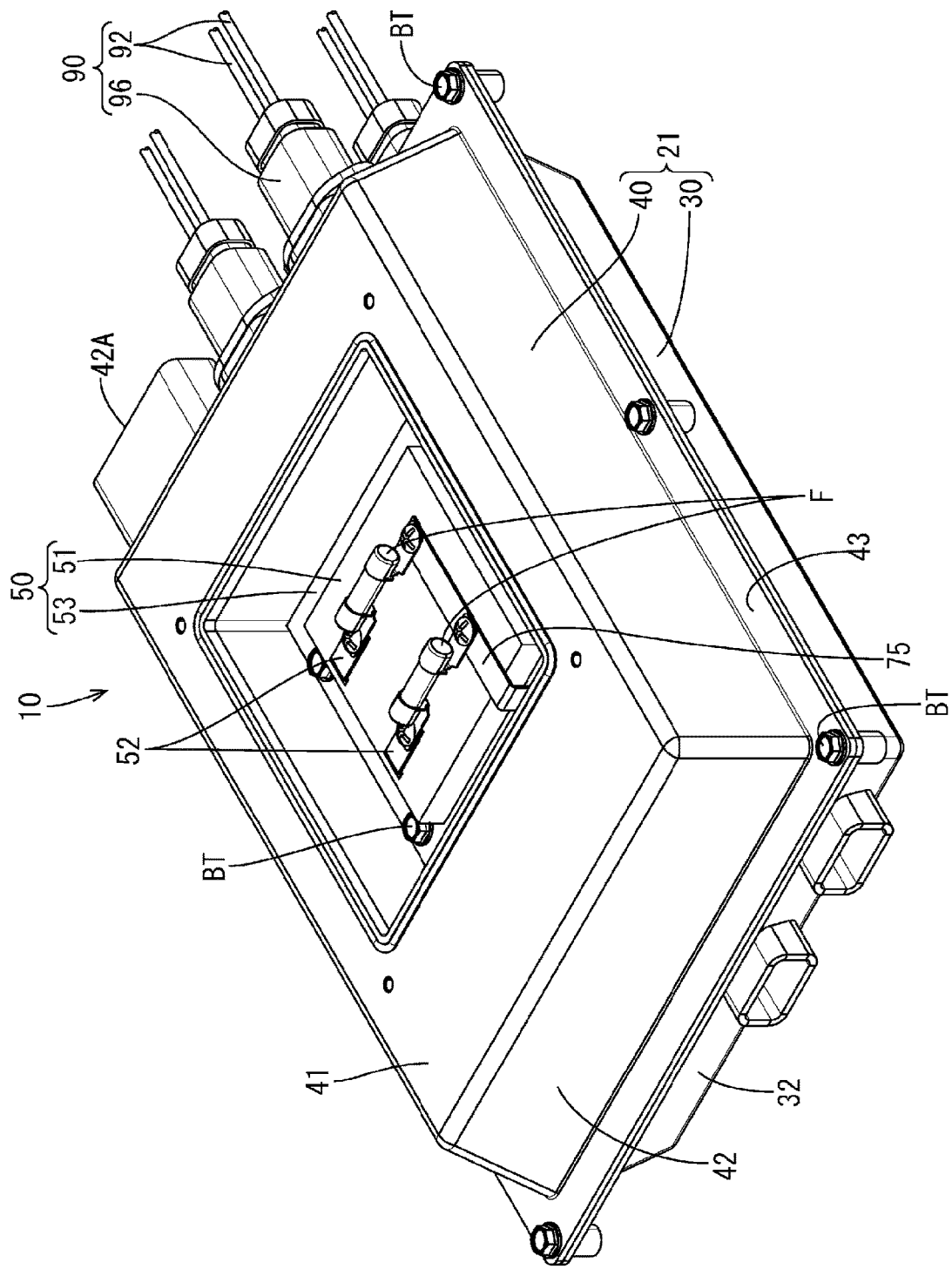
FIG. 11 is a perspective view of the electrical connection box with a cover removed.
Figure 12:
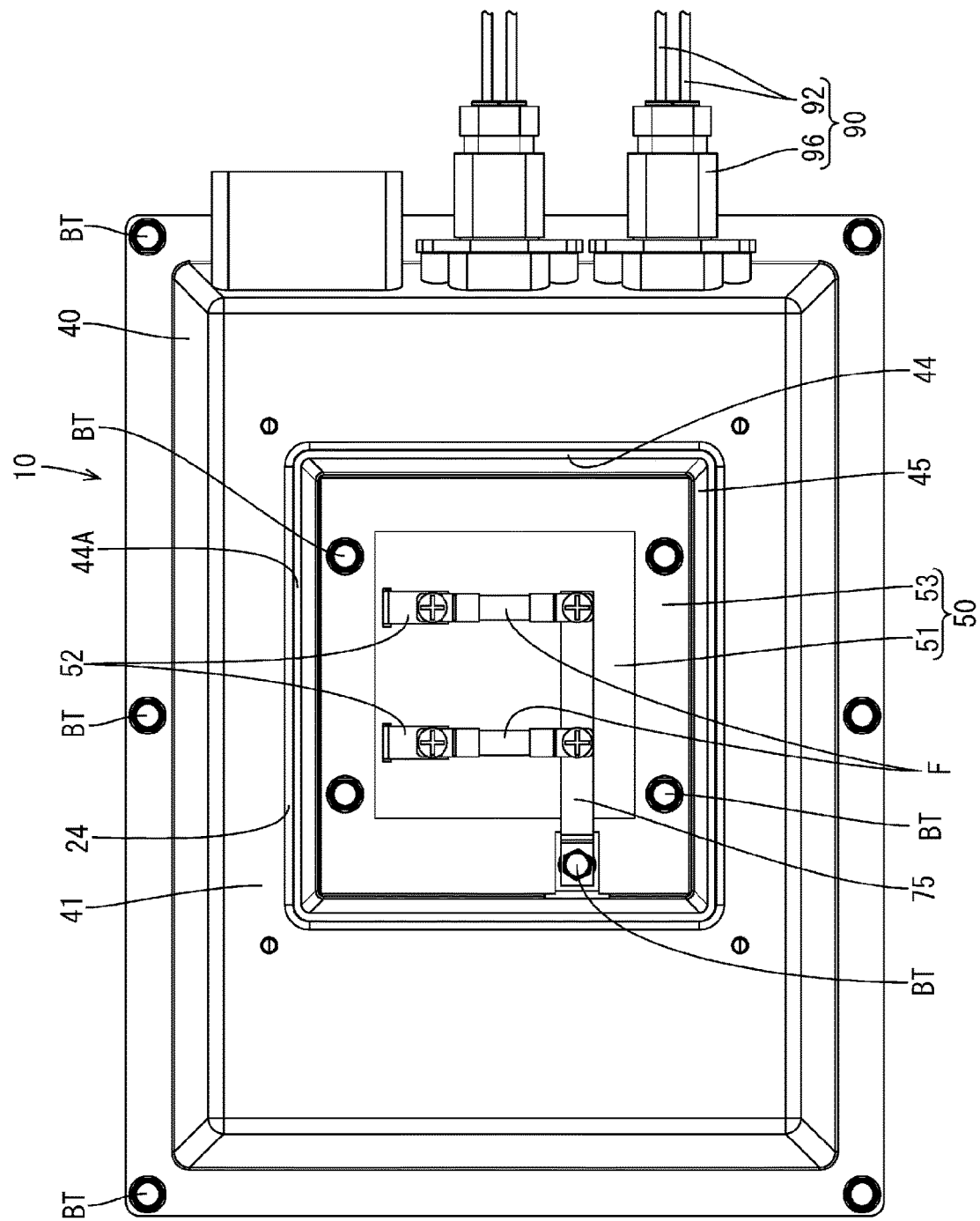
FIG. 12 is a plan view of the electrical connection box with the cover removed.

The base receiving portion 45 includes a rectangular bottom portion 48 that is slightly smaller than the first working hole 44. Accordingly, as illustrated in FIGS. 11 and 12, the bottom portion 48 faces upward through the first working hole 44.

Figure 13:
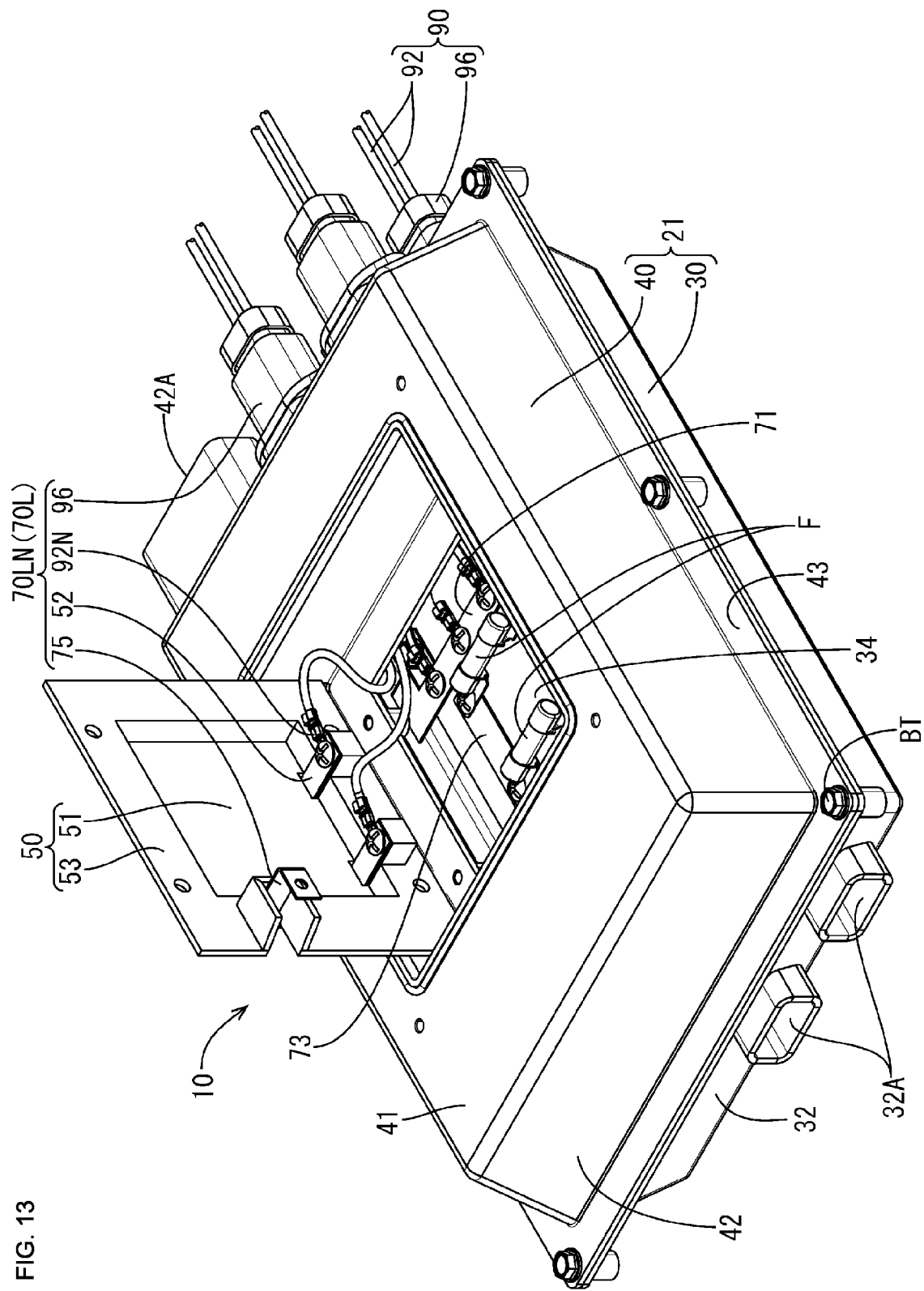
FIG. 13 is a perspective view of the electrical connection box with the cover and an upper base removed.
Figure 14:
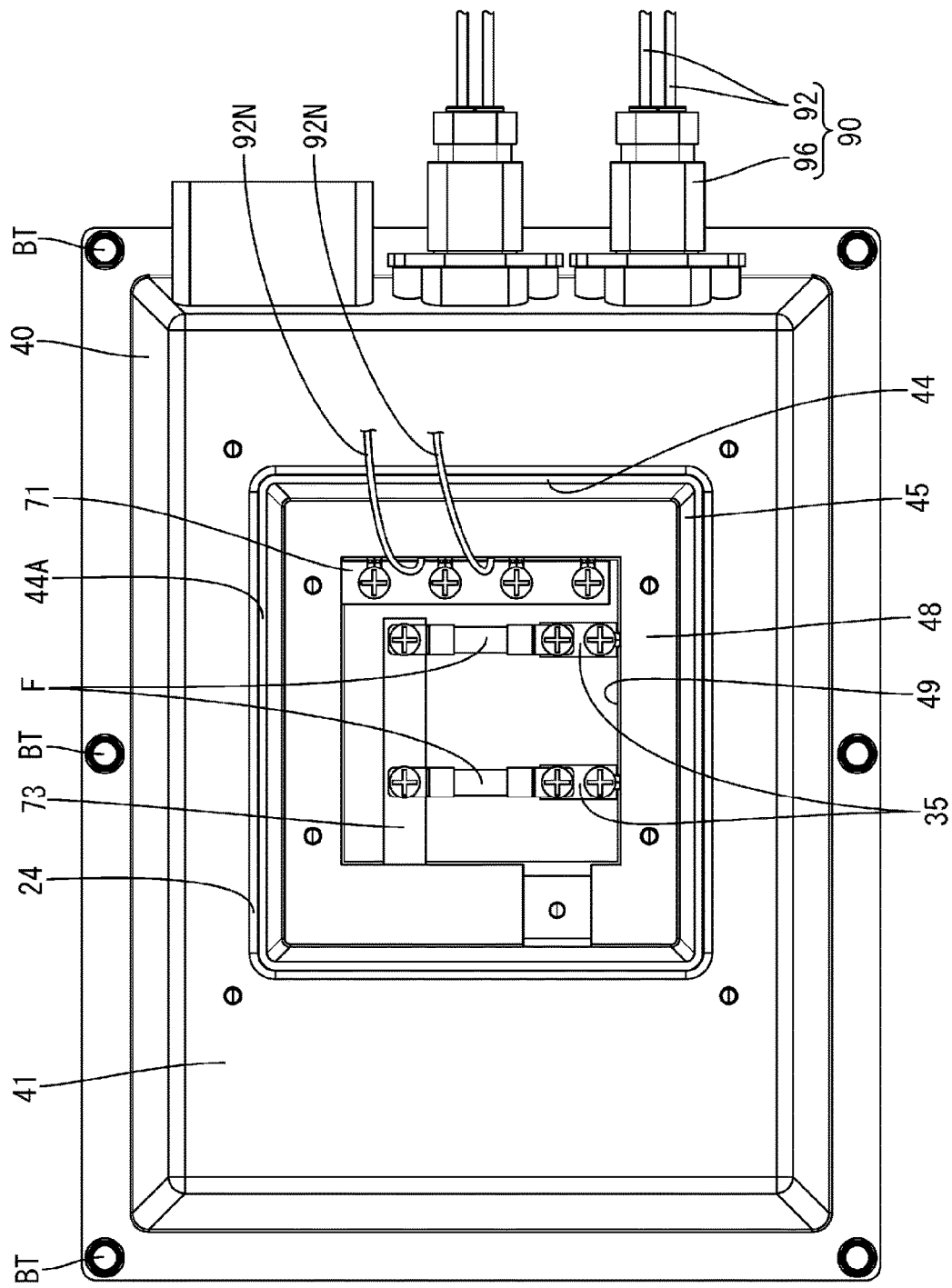
FIG. 14 is a plan view of the electrical connection box with the cover and the upper base removed.

As illustrated in FIGS. 10, 13, 14, a second working hole 49 is formed in the rectangular bottom portion 48 of the base receiving portion 45. The second working hole 49 is formed in a rectangular shape extending through the bottom portion 48 in the vertical direction. The second working hole 49 is disposed above the lower base 34 of the lower case 30 and next to the first working hole 44 in the vertical direction.

In other words, as illustrated in FIGS. 9, 10, and 14, the first working hole 44 and the second working hole 49 are regions where the power supply circuit 60 is not exposed upward that are disposed next to one another in the vertical direction at a position allowing the lower base 34 of the lower case 30 to face upward.

An upper base 50 is configured to be detachably attached to the bottom portion 48 of the base receiving portion 45 from above. Accordingly, as illustrated in FIGS. 11 and 12, with the upper base 50 installed on the base receiving portion 45, the upper base 50 faces upwards through the first working hole 44.

As illustrated in FIGS. 1 and 13, the upper base 50 is formed in a rectangular shape in a plan view with a size slightly larger than the second working hole 49 of the base receiving portion 45 in the front-and-back and left-and-right directions. The upper base 50 includes a member placement portion 51 with a rectangular shape in a plan view and a fixing portion 53 provided on the periphery of the member placement portion 51.

As illustrated in FIGS. 8 to 11, the member placement portion 51 is formed a step higher than the fixing portion 53. On the member placement portion 51, a second negative electrode branch bus bar 75, of the plurality of branch bus bars 71, a pair of second relay bus bars 52, and two fuses F are able to be placed. In other words, as illustrated in FIGS. 11 and 12, the upper base 50 on which the two fuses F are placed faces upwards through the first working hole 44.

As illustrated in FIGS. 5, 9, 10, and 13, the pair of second relay bus bars 52 are fixed to the member placement portion 51 on the right end portion of the member placement portion 51 extending through the member placement portion 51 in the vertical direction. The fuses F placed on the member placement portion 51 are connected to a portion of the second relay bus bars 52 disposed above the member placement portion 51. Also, the wire harnesses 90 are connected to the lower end portion of the second relay bus bars 52 extending downward from the member placement portion 51.

The fixing portion 53 is contiguous with the periphery of the member placement portion 51 and formed down a step from the member placement portion 51. When the upper base 50 is installed on the base receiving portion 45, as illustrated in FIGS. 8 to 10, the fixing portion 53 is disposed on the bottom portion 48 at the peripheral edge portion of the second working hole 49. The upper base 50 is configured to be fixed to the base receiving portion 45 by the fixing portion 53 being fixed to the bottom portion 48 from above via four bolts BT. Also, as illustrated in FIG. 13, the upper base 50 is able to be detached from the base receiving portion 45 by removing the four bolts BT.

In other words, the upper base 50 is detachably attached to the base receiving portion 45 through the first working hole 44.

The four upper side plates 42 are formed extending downward from the outer side edges of the ceiling plate 41.

Adjacent upper side plates 42 are contiguous at the side edges. Thus, as illustrated in FIGS. 5 and 7 to 10, the upper case 40 is formed in a tray-like shape, and the branch circuit 70 described below can be housed in the upper case 40 from below.

Figure 7:
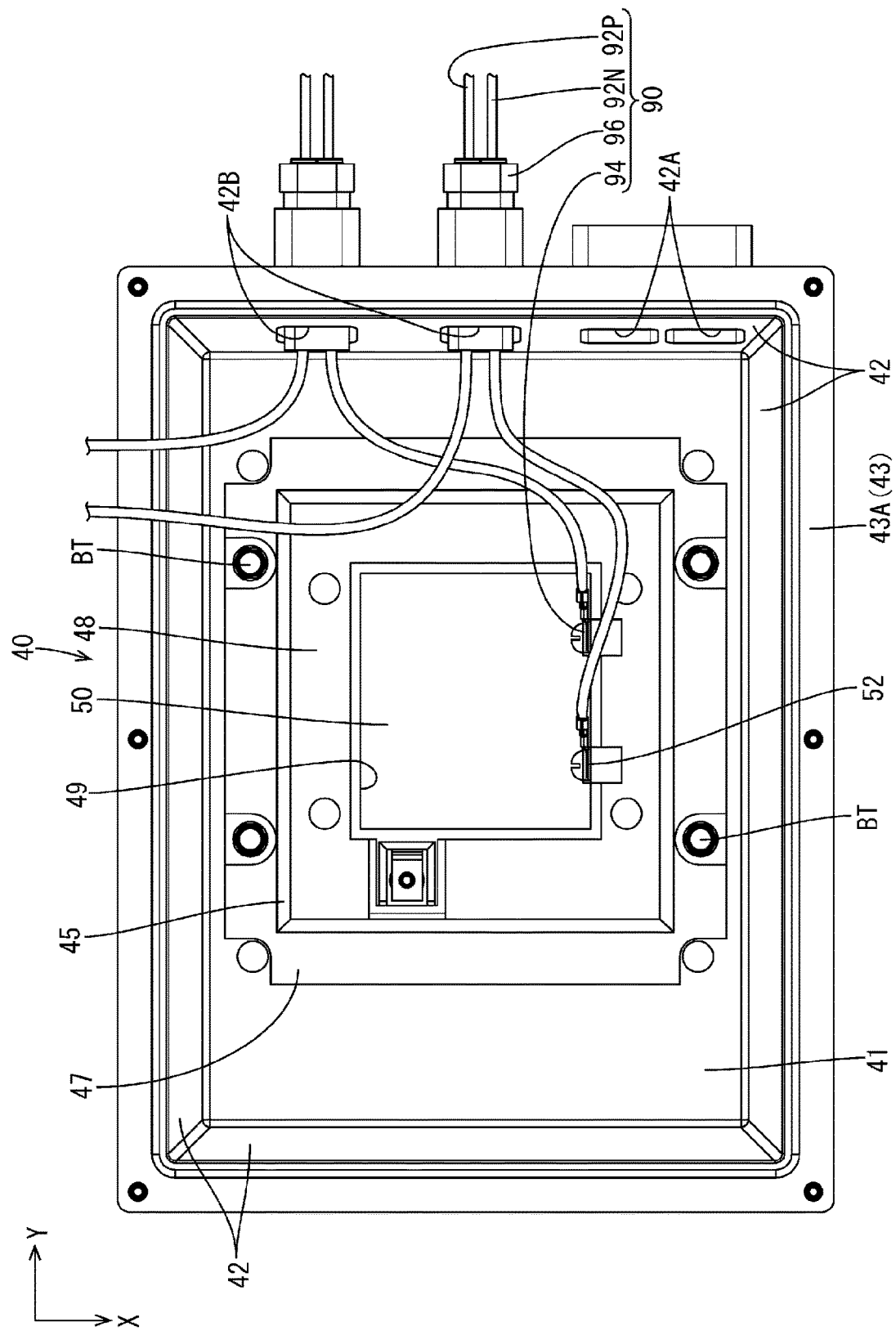
FIG. 7 is a bottom view of the upper case with an upper branch circuit housed therein.

As illustrated in FIGS. 5 and 7, in the upper side plates 42 on the back side, from among the four upper side plates 42, a pair of back cable entry openings 42A and a pair of connector attachment openings 42B are formed extending through the upper side plates 42 in the front-and-back direction.

Non-illustrated power supply cables connected to the pair of power supply bus bars 61 described below are able to be inserted in the pair of back cable entry openings 42A in a waterproof state.

In the pair of connector attachment openings 42B, two wire harnesses 90, from among the plurality of wire harnesses 90, are attached in a waterproof state.

Figure 3:
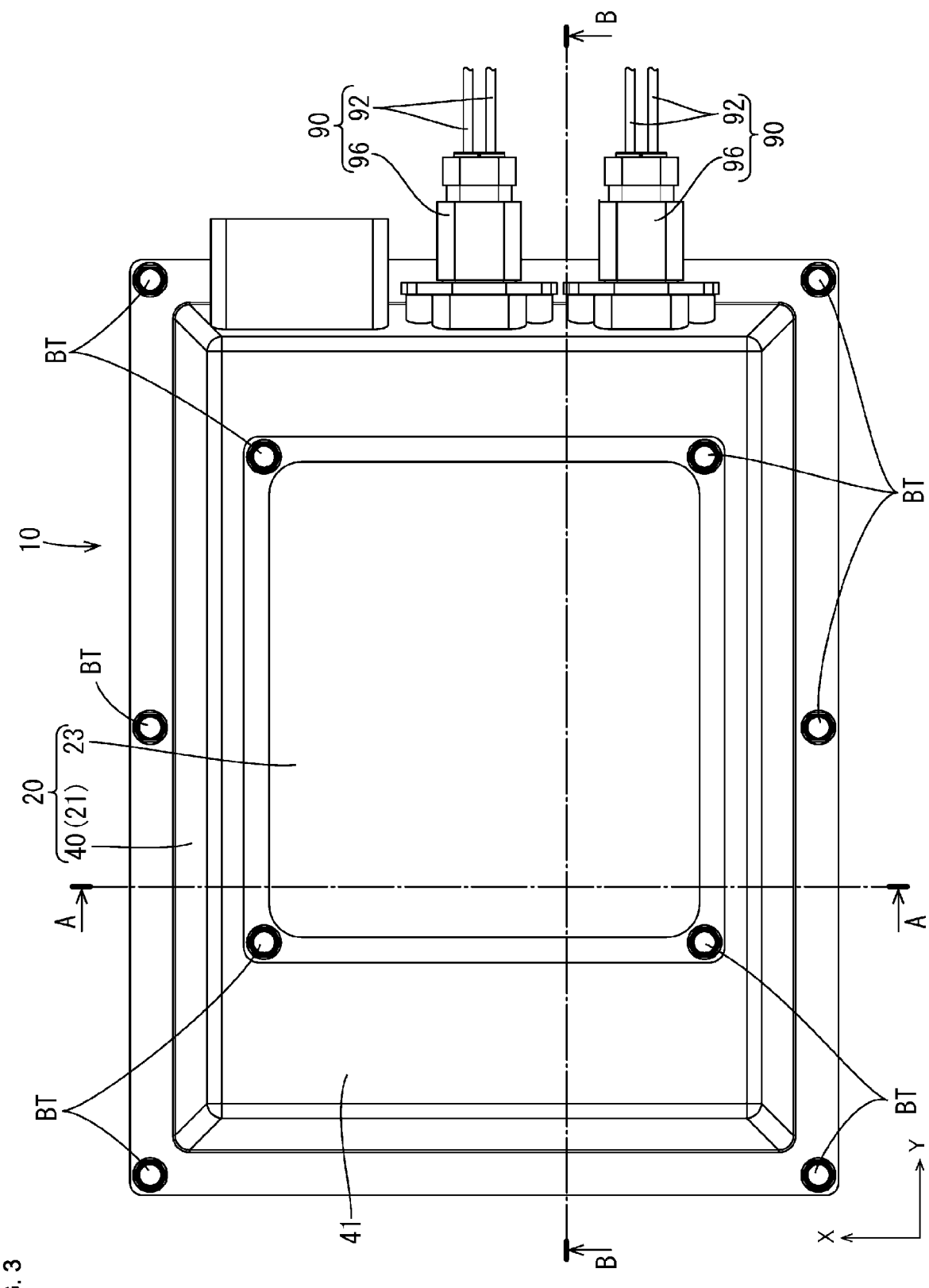
FIG. 3 is a plan view of the electrical connection box.
Figure 4:
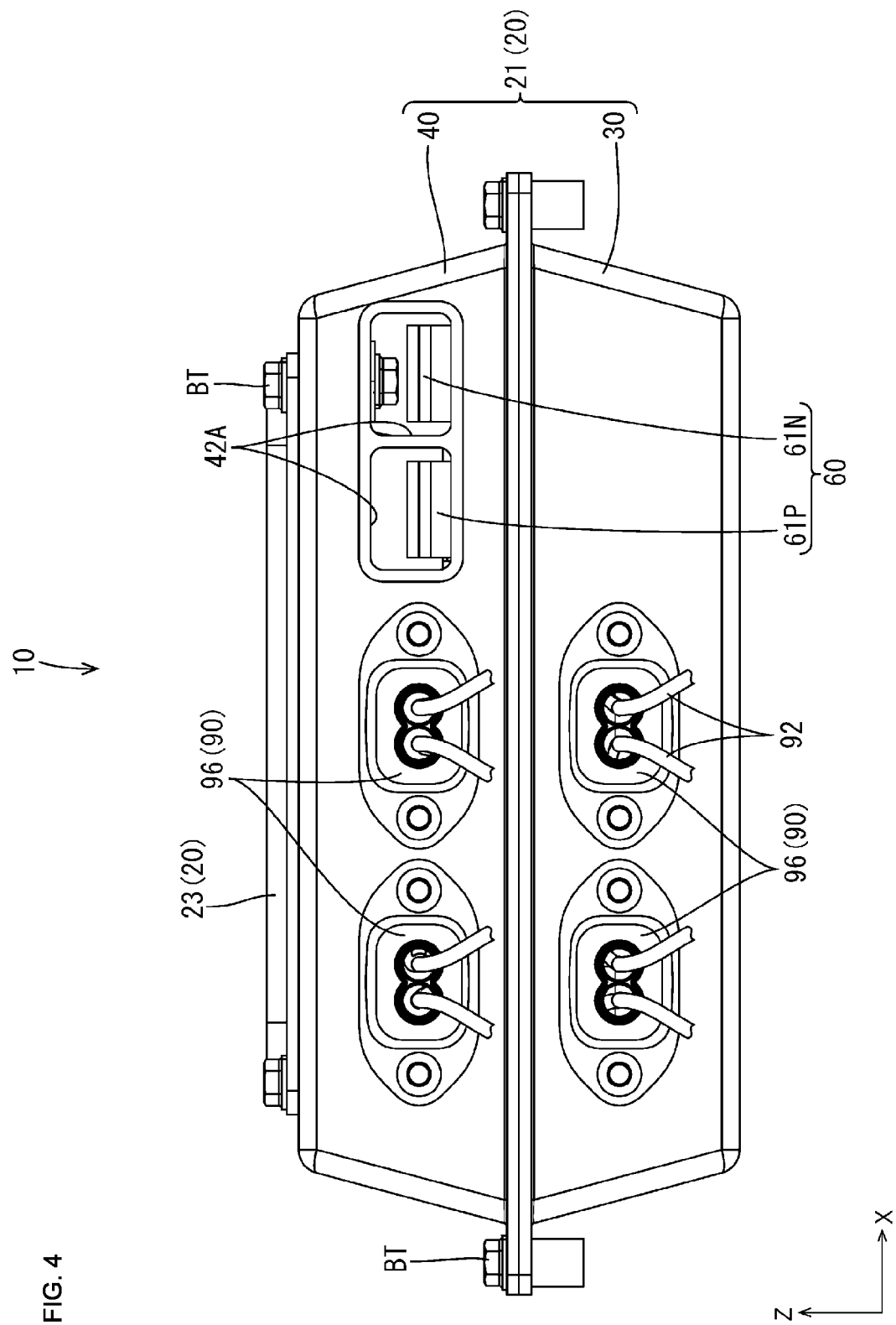
FIG. 4 is a back view of the electrical connection box.

The upper flange portion 43 is formed along the lower edges of the four upper side plates 42. The upper flange portion 43 is formed in a rectangular shape along the upper edges of the upper case 40 extending outward from the upper side plates 42. As illustrated in FIG. 3, the upper flange portion 43 is fixed to the lower flange portion 33 via six bolts BT disposed side by side on the long side ends. In this manner, the upper case 40 is fixed to the lower case 30.

The lower surface of the upper flange portion 43 corresponds with a flat sealing surface 43A. As illustrated in FIGS. 8 to 10, when the upper case 40 is fixed to the lower case 30, the sealing surface 43A, together with the bottom surface of the sealing groove 36, sandwiches the case sealing member 25 in the vertical direction. In other words, the case sealing member 25 is in close contact with the sealing surface 43A and the bottom surface of the sealing groove 36 all around, forming a seal between the lower flange portion 33 and the upper flange portion 43. Explaining it yet another way, the upper case 40, the lower case 30, and the case sealing member 25 are integrally formed, forming the case body 21 with a seal formed between the upper case 40 and the lower case 30.

Cover Sealing Member 24

The cover sealing member 24 is an elastic member made of rubber or the like formed in a rectangular ring-like shape. The cover sealing member 24 is formed larger than the seal installation rib 44A in the vertical direction. Accordingly, when the cover sealing member 24 is installed on the periphery of the seal installation rib 44A, the cover sealing member 24 projects upward past the seal installation rib 44A.

Cover 23

As illustrated in FIGS. 1 to 4, the cover 23 is formed in a rectangular plate-like shape that is larger than the first working hole 44 of the case body 21 in the front-and-back and left-and-right directions. The cover 23 is fixed to the upper case 40 by the four corners of the cover 23 being bolted to the ceiling plate 41.

As illustrated in FIGS. 8 to 10, all around the peripheral edge portion of the cover 23, a cover sealing surface 23A that comes into contact with the cover sealing member 24 from above is formed. The cover sealing surface 23A, together with the ceiling plate 41, sandwich the cover sealing member 24 in the vertical direction by the cover 23 being fixed to the upper case 40. In this manner, the cover sealing member 24 is brought into close contact with the cover 23 and the ceiling plate 41, and the first working hole 44 is closed and sealed watertight by the cover 23 and the cover sealing member 24.

Power Supply Bus Bars 61

The pair of power supply bus bars 61 are formed by processing metal plate material having electrical conductivity. As illustrated in FIGS. 5 and 6, the majority of the pair of power supply bus bars 61 is housed inside the lower case 30. Regarding the pair of power supply bus bars 61, one corresponds to a negative electrode bus bar 61N and other corresponds to a positive electrode bus bar 61P. In the present embodiment, from among the power supply bus bars 61, the power supply bus bar 61 disposed to the back of the front cable entry openings 32A on the left side corresponds to the positive electrode bus bar 61P, and the power supply bus bar 61 disposed to the back of the front cable entry openings 32A on the right side corresponds to the negative electrode bus bar 61N. Power supply cables of corresponding polarities are connected to the end portions of the power supply bus bars 61. In other words, the power supply circuit 60 is formed by a large current being applied to the pair of power supply bus bars 61.

As illustrated in FIG. 6, the positive electrode bus bar 61P is provided with a first positive electrode portion 62, a second positive electrode portion 63, and a third positive electrode portion 64. The first positive electrode portion 62 extends backwards from a position to the back of the front cable entry openings 32A on the left side, conforming to the shape of the lower side plate 32 on the left side. The second positive electrode portion 63 extends to the right from the back end portion of the first positive electrode portion 62 to a right portion of the lower case 30 between the lower base 34 and the lower side plate 32 on the back side. The third positive electrode portion 64 extends in a crank-like shape from the right end portion of the second positive electrode portion 63 to the back cable entry opening 42A on the left side of the upper case 40. The positive electrode bus bar 61P is fixed to the lower case 30 by the front end portion of the first positive electrode portion 62 and the right end portion of the second positive electrode portion 63 being bolted to a bolt fixing portion 37 of the lower case 30.

The negative electrode bus bar 61N is provided with a first negative electrode portion 65, a second negative electrode portion 66, and a third negative electrode portion 67.

The first negative electrode portion 65 extends, rising up a step, backwards from a position to the back of the front cable entry openings 32A on the right side to a position before the lower base 34. The second negative electrode portion 66 extends, in a contiguous manner from the back end portion of the first negative electrode portion 65, to the right from a position just to the right of the first negative electrode portion 65 to a right portion of the lower case 30. The third negative electrode portion 67 extends in a straight manner from the rear end portion of the second negative electrode portion 66 to the right back end portion of the lower case 30. Also, the back end portion of the third negative electrode portion 67 extends in a crank-like shape to the back cable entry opening 42A of the right side of the upper case 40. The negative electrode bus bar 61N is fixed to the lower case 30 by the right end portion of the second negative electrode portion 66 and the central portion in the left-and-right direction being bolted to the bolt fixing portion 37 of the lower case 30.

Branch Bus Bars 71

The plurality of branch bus bars 71 are formed by processing metal plate material that are thinner in plate thickness than the power supply bus bars 61 and have electrical conductivity.

As illustrated in FIGS. 1 and 5, the plurality of branch bus bars 71 include a total of three branch bus bars 71, the positive electrode branch bus bar 72, the first negative electrode branch bus bar 73, and the second negative electrode branch bus bar 75.

As illustrated in FIGS. 6 and 10, the positive electrode branch bus bar 72, together with the right end portion of the second positive electrode portion 63 of the positive electrode bus bar 61P, is bolted to the bolt fixing portion 37 of the lower case 30. In this manner, the positive electrode branch bus bar 72 is electrically connected to the positive electrode bus bar 61P.

The positive electrode branch bus bar 72 extends frontward in a crank-like shape from a position on the right end portion of the second positive electrode portion 63 to a position at the same height as the upper surface of the lower base 34, then extends left on the back portion of the lower base 34.

To the portion of the positive electrode branch bus bar 72 disposed above the lower base 34, four wire harnesses 90, described below, are connected side by side one another in the left-and-right direction.

As illustrated in FIGS. 5, 6, and 8, the first negative electrode branch bus bar 73, together with the central portion in the left-and-right direction of the second negative electrode portion 66 of the negative electrode bus bar 61N, is bolted to the bolt fixing portion 37 of the lower case 30. In this manner, the first negative electrode branch bus bar 73 is electrically connected to the negative electrode bus bar 61N. The first negative electrode branch bus bar 73 extends in a crank-like shape from a position on the central portion in the left-and-right direction of the second negative electrode portion 66 to the upper surface of the lower base 34, then extends in the front-and-back direction on the right portion of the lower base 34. To the portion of the first negative electrode branch bus bar 73 disposed above the lower base 34, two fuses F, described below, are connected side by side one another in the front-and-back direction.

As illustrated in FIGS. 8 and 9, the second negative electrode branch bus bar 75, together with the left end portion of the second negative electrode portion 66, is bolted to the bolt fixing portion 37 of the lower case 30. In this manner, the second negative electrode branch bus bar 75 is electrically connected to the negative electrode bus bar 61N. The second negative electrode branch bus bar 75 extends in a crank-like shape from a position on the left end portion of the second negative electrode portion 66 to a position on the member placement portion 51 of the upper base 50 of the upper case 40, then extends in the front-and-back direction on the left portion of the member placement portion 51. In other words, as illustrated in FIGS. 8 and 9, the second negative electrode branch bus bar 75 extends in the vertical direction (the direction in which the lower case 30 and the upper case 40 are assembled) and is connected to the power supply circuit 60. To the portion of the second negative electrode branch bus bar 75 disposed above the member placement portion 51, two fuses F, described below, are connected side by side one another in the front-and-back direction.

Fuses F

As illustrated in FIGS. 5, 6, 8, and 9, the fuses F are typical fuses that are attached to the branch circuit 70 and stops a current of a predetermined value or greater.

As illustrated in FIG. 9, each one of the plurality of fuses F includes a cylindrical body portion F1 and a pair of terminal portions F2 provided on both ends of the body portion F1. A non-illustrated fusing portion is provided inside the body portion F1. In a case where too much current flows through the body portion F1, the fusing portion melts, stopping the overcurrent. The pair of terminal portions F2 extend from the body portion F1 in a plate-like shape in directions away from one another.

As illustrated in FIGS. 5 and 6, the fuses F placed on the lower base 34 are disposed spanning between the right end portion of the first relay bus bar 35 and the first negative electrode branch bus bar 73 in the left-and-right direction.

The fuses F are electrically connected to one another by the terminal portions F2 being screwed to the lower base 34, together with the first relay bus bars 35 and the first negative electrode branch bus bar 73.

As illustrated in FIGS. 8, 9, 11, and 12, the fuses F placed on the member placement portion 51 are disposed spanning between the second relay bus bars 52 and the second negative electrode branch bus bar 75 in the left-and-right direction. The fuses F are electrically connected to one another by the terminal portions F2 being screwed to the member placement portion 51, together with the second relay bus bars 52 and the second negative electrode branch bus bar 75.

Wire Harnesses 90

As illustrated in FIG. 1, each one of the wire harnesses 90 includes a pair of electrical wires 92, a pair of terminals 94, and a connector 96.

The electrical wires 92 are typical coated wire formed of a core wire covered with an insulating cover. As illustrated in FIGS. 5 to 7, one electrical wire 92 of the pair of electrical wires 92 corresponds to a positive electrode electrical wire 92P connected to the positive electrode side, and the other electrical wire 92 corresponds to a negative electrode electrical wire 92N connected to the negative electrode side.

The terminals 94 are crimped and electrically connected to the front end portions of the electrical wires 92.

The pair of terminals 94 are made of a metal having electrical conductivity. The terminal 94 connected to the positive electrode electrical wire 92P is screwed to the positive electrode branch bus bar 72 and electrically connected thereto. The terminal 94 connected to the negative electrode electrical wire 92N is screwed to either the first negative electrode branch bus bar 73 or the second negative electrode branch bus bar 75 and electrically connected thereto.

The connector 96 is electrically connected to the back end portions of the pair of electrical wires 92. The connector 96 is fixed to the lower case 30 and the connector attachment openings 32B, 42B of the upper case 40 in a waterproof state. In this manner, two wire harnesses 90 are attached to the lower case 30 and two wire harnesses 90 are attached to the upper case 40 in a waterproof state.

As illustrated in FIGS. 5 and 6, the terminals 94 of the negative electrode electrical wires 92N of the two wire harnesses 90 attached to the lower case 30 are screwed and connected to the left end portion of the first relay bus bars 35 of the lower base 34. In this manner, the two wire harnesses 90 attached to the lower case 30 are electrically connected to the negative electrode bus bar 61N via the first negative electrode branch bus bar 73, the fuses F, and the first relay bus bars 35.

Also, as illustrated in FIGS. 5 and 7, the terminals 94 of the negative electrode electrical wires 92N of the two wire harnesses 90 attached to the upper case 40 are screwed and connected to the lower end portion of the second relay bus bars 52 of the member placement portion 51. In this manner, the two wire harnesses 90 attached to the upper case 40 are electrically connected to the negative electrode bus bar 61N via the second negative electrode branch bus bar 75, the fuses F, and the second relay bus bars 52.

Accordingly, as illustrated in FIGS. 5 and 6, in the lower case 30, two sets are housed, a lower negative electrode circuit 70LN including the negative electrode electrical wire 92N of the wire harnesses 90, the first relay bus bar 35, the fuse F, and the first negative electrode branch bus bar 73 and a lower branch circuit 70L including a lower positive electrode circuit 70LP that includes the positive electrode electrical wire 92P of the wire harnesses 90 and the positive electrode branch bus bar 72.

Also, as illustrated in FIGS. 5 and 9, in the upper case 40, two sets are housed, an upper negative electrode circuit 70UN including the negative electrode electrical wire 92N of the wire harnesses 90, the second relay bus bars 52, the fuse F, and the second negative electrode branch bus bar 75 and an upper branch circuit 70U including an upper positive electrode circuit 70UP that includes the positive electrode electrical wire 92P of the wire harnesses 90 and the positive electrode branch bus bar 72.

In other words, the lower branch circuit 70L disposed in the lower case 30 and the upper branch circuit 70U disposed in the upper case 40 are disposed on top of one another in the vertical direction to form the branch circuit 70 branched out from the power supply circuit 60.

Process of Fuse Replacement

The electrical connection box 10 of the present embodiment has the configuration described above. Next, an example of a process for replacing the fuse F in the upper branch circuit 70U will be described, followed by an example of a process for replacing the fuse F in the lower branch circuit 70L.

To replace the fuse F in the upper branch circuit 70U disposed in the upper case 40, first, the four bolts BT attached to the cover 23 are removed. Then, as illustrated in FIGS. 11 and 12, when the cover 23 is removed from the ceiling plate 41, the first working hole 44 is exposed, and the fuse F of the upper negative electrode circuit 70UN disposed on the member placement portion 51 of the upper base 50 is facing upward from the first working hole 44. Accordingly, the work to replace the fuse F of the upper negative electrode circuit 70UN can be easily performed by a worker utilizing the first working hole 44.

Next, to replace the fuse F of the lower negative electrode circuit 70LN disposed in the lower case 30, the four bolts BT of the fixing portion 53 of the upper base 50 are removed utilizing the first working hole 44. Then, as illustrated in FIGS. 13 and 14, the upper base 50 is removed upward utilizing the first working hole 44.

Because the negative electrode electrical wire 92N of the wire harnesses 90 attached to the upper case 40 is connected to the second relay bus bars 52 disposed on the member placement portion 51 of the upper base 50 via the terminals 94, the upper base 50 is removed in a manner such that a tensile load is not placed on the negative electrode electrical wire 92N or the terminals 94 of the wire harnesses 90.

Then, the second working hole 49 of the base receiving portion 45 closed at the upper base 50 is opened. Accordingly, the fuse F of the lower negative electrode circuit 70LN fixed on the lower base 34 is facing upward from the second working hole 49 and the first working hole 44. Accordingly, the work to replace the fuse F of the lower negative electrode circuit 70LN can be easily performed by a worker utilizing the second working hole 49 and the first working hole 44.

In other words, in the present embodiment, only the upper base 50 when the fuse F of the upper branch circuit 70U is disposed is able to be exposed by removing the cover 23 from the upper case 40. Also, only the lower base 34 where the fuse F of the lower branch circuit 70L is disposed is able to be exposed by removing the upper base 50 of the upper case 40.

In other words, in the present embodiment, the waterproofness of the electrical connection box 10 is increased and the work to replace a fuse F is made easier compared to an electrical connection box in which a fuse is replaced with the upper case removed from the lower case and the upper branch circuit and the lower branch circuit widely exposed.

As described above, the present embodiment is the electrical connection box 10 provided with the case 20, the power supply circuit 60, and the branch circuit 70. The branch circuit 70 is a circuit including detachable fuses (overcurrent protection elements) F that branches from the power supply circuit 60. The case 20 includes the case body 21, the cover 23 detachably attached to the case body 21, and the cover sealing member 24. The case body 21 includes the first working hole 44 and houses the power supply circuit 60 and the branch circuit 70. The first working hole 44, as illustrated in FIGS. 8 to 10, extends through the ceiling plate 41 of the case body 21 at a position that allows the fuse F to face upward (outward) and is formed with external shape dimensions smaller than the external shape dimensions of the ceiling plate 41. The cover 23 is installed on the case body 21 in a manner such that the first working hole 44 is closed watertight. The cover sealing member 24 is brought into close contact with the peripheral edge portion of the first working hole 44 of the case body 21 and the cover 23.

As illustrated in FIGS. 11 and 12, because the fuse F faces upward through the first working hole 44 when the cover 23 is removed from the case body 21, the fuse F can be easily replaced utilizing the first working hole 44. In this manner, the work to replace the fuse F can be made easier. Also, when the cover 23 is installed on the case body 21 with the first working hole 44 being formed with external shape dimensions smaller than the external shape dimensions of the ceiling plate 41 of the case body 21, the first working hole 44 is closed liquid-tight via the cover 23. Accordingly, compared to an example in which the case opens widely, the waterproofness of the electrical connection box 10 can be increased.

The case body 21 includes the lower case 30, the upper case 40, and the case sealing member 25 having elasticity. The lower case 30 and the upper case 40 are configured to be assembled together. The case sealing member 25 is configured to come into close contact with the lower case 30 and the upper case 40 and form a watertight seal between the lower case 30 and the upper case 40, the branch circuit 70 includes the lower branch circuit 70L disposed in the lower case 30 and the upper branch circuit 70U disposed in the upper case 40. The lower case 30 includes at least one connector 96 connected to the lower branch circuit 70L. The upper case 40 includes at least one connector 96 connected to the upper branch circuit 70U. As illustrated in FIG. 8, the lower branch circuit 70L and the upper branch circuit 70U are disposed side by side in the direction in which the lower case 30 and the upper case 40 are assembled together.

For example, in a case where a connector connected to a branch circuit is provided in both the lower case and the upper case, connecting a branch circuit disposed in the lower case and the connector provided in the upper case via an electrical wire is a plausible method. However, with this method, an area for disposing the upper case is ensured with space provided just for providing the connector. This creates dead space in the upper case and makes the overall size of the electrical connection box be made larger.

However, with the present embodiment, the lower branch circuit 70L to which the connector 96 of the lower case 30 is connected is disposed in the lower case 30, and the upper branch circuit 70U to which the connector 96 of the upper case 40 is connected is disposed in the upper case 40. In other words, by effectively utilizing the waterproof inside of the case body 21, the case body 21 can have a smaller size, allowing for the electrical connection box 10 to have a smaller size.

The power supply circuit 60 is disposed in the lower case 30, and the upper branch circuit 70U includes the second negative electrode branch bus bar 75 (branch bus bar 71) connected to the power supply circuit 60 as illustrated in FIGS. 8 and 9.

For example, an electrical connection box in which an electrical wire of an upper branch circuit is connected to a power supply circuit disposed in the lower case must include a surplus length housing region in the case for housing the surplus length of the electrical wire for when assembling the lower case and the upper case together. Thus, the size of the case is increased by the size needed for the surplus length housing region.

However, because the upper branch circuit 70U of the present embodiment includes the second negative electrode branch bus bar 75 that extends in the vertical direction and connects to the power supply circuit 60, there is no need to include a surplus length housing region in the case 20 for when assembling the lower case 30 and the upper case 40, allowing the case 20 to have a smaller size. Accordingly, the electrical connection box 10 can further have a smaller size.

As illustrated in FIG. 9, the upper case 40 includes the upper base 50 where the fuse F of the upper branch circuit 70U is disposed. The lower case 30 includes the lower base 34 where the fuse F of the lower branch circuit 70L is disposed. The upper base 50 and the lower base 34 are disposed next to one another in the vertical direction (the direction in which the lower case 30 and the upper case 40 are assembled together).

Because the upper base 50 and the lower base 34 are disposed next to one another in the vertical direction, compared to an example in which an upper base and a lower base are disposed offset from one another in the front-and-back and left-and-right directions intersecting with the vertical direction for example, the case body 21, i.e., the electrical connection box 10, does not need to be increased in size in the front-and-back and left-and-right directions.

Also, the upper case 40 includes the base receiving portion 45 from which the upper base 50 can be detached, and, as illustrated in FIGS. 13 and 14, the base receiving portion 45 includes the second working hole 49 closed by the upper base 50.

The lower base 34 can be made to face upward through the first working hole 44 and the second working hole 49 by removing the upper base 50 from the base receiving portion 45. Accordingly, the fuse F disposed in the lower base 34 can be replaced utilizing the first working hole 44 and the second working hole 49. In this manner, compared to an example in which the entire circuit including the power supply circuit is exposed to replace the fuse, the waterproofness can be increased, and the work to replace the fuse F can be made easier.

For example, when connecting a bus bar of an upper branch circuit to a power supply circuit when assembling a lower case and an upper case together, depending on the case, the connection state of the bus bar and the power supply circuit cannot be visually confirmed, for example. For such examples, the work to connect the upper branch circuit and the power supply circuit is made difficult.

However, with the present embodiment, because the second negative electrode branch bus bar 75 can be detached from the power supply circuit 60 utilizing the first working hole 44, for example, when the lower case and the upper case are assembled together, the work to connect the power supply circuit 60 and the upper branch circuit 70U is made very easy compared to an example in which the bus bar of the upper branch circuit is connected to the power supply circuit.

Other Embodiments

The technology disclosed in the present specification is not limited to the embodiments described above with reference to the drawings, and, for example, the following embodiments are also included.

1. In the embodiment described above, the overcurrent protection element is configured as the fuse F including the cylindrical body portion F1. However, no such limitation is intended, and a fuse including a body portion with edges may be used as the overcurrent protection element.

2. In the embodiment described above, two wire harnesses 90 are attached to the lower case 30 and two wire harnesses 90 are attached to the upper case 40. However, no such limitation is intended, and one or three or more wire harnesses may be attached to each case.

3. In the embodiment described above, the first working hole 44 and the cover 23 and the second working hole 49 and the upper base 50 have a rectangular shape. However, no such limitation is intended, and the first working hole and the cover and the second working hole and the upper base may have a circular shape, an elliptical shape, or the like.

LIST OF REFERENCE NUMERALS

10 Electrical connection box
20 Case
21 Case body
23 Cover
23A Cover sealing surface
24 Cover sealing member
25 Case sealing member
30 Lower case
31 Bottom plate
32 Lower side plate
32A Front cable entry opening
32B Connector attachment opening
33 Lower flange portion
34 Lower base
35 First relay bus bar
36 Sealing groove
37 Bolt fixing portion
40 Upper case
41 Ceiling plate
42 Upper side plate
42A Back cable entry opening
42B Connector attachment opening
43 Upper flange portion
43A Sealing surface
44 First working hole
44A Seal installation rib
45 Base receiving portion
47 Attachment flange
48 Bottom portion
49 Second working hole
50 Upper base
51 Member placement portion
52 Second relay bus bar
53 Fixing portion
60 Power supply circuit
61 Power supply bus bar
61N Negative electrode bus bar
61P Positive electrode bus bar
62 First positive electrode portion
63 Second positive electrode portion
64 Third positive electrode portion
65 First negative electrode portion
66 Second negative electrode portion
67 Third negative electrode portion
70 Branch circuit
70L Lower branch circuit
70LN Lower negative electrode circuit
70LP Lower positive electrode circuit
70U Upper branch circuit
70UN Upper negative electrode circuit
70UP Upper positive electrode circuit
71 Branch bus bar
72 Positive electrode branch bus bar
73 First negative electrode branch bus bar
75 Second negative electrode branch bus bar
90 Wire harness
92 Electrical wire
92N Negative electrode electrical wire
92P Positive electrode electrical wire
94 Terminal
96 Connector
BT Bolt
F1 Body portion
F2 Terminal portion
F Fuse

The invention claimed is:

1. An electrical connection box, comprising:
a case;
a power supply circuit; and
a branch circuit, wherein
the branch circuit is a circuit that includes a detachable overcurrent protection element and branches from the power supply circuit;
the case includes a case body, a cover detachably attached to the case body, and a cover sealing member having elasticity;
the case body includes a first working hole and houses the power supply circuit and the branch circuit;
the first working hole extends through a ceiling plate of the case body at a position that allows the overcurrent protection element to face outward and is formed with external shape dimensions smaller than external shape dimensions of the ceiling plate;
the cover is installed on the case body in a manner such that the first working hole is closed;
the cover sealing member is brought into close contact with a peripheral edge portion of the first working hole of the case body and the cover; and
the cover sealing member is sandwiched between the ceiling plate and a peripheral edge portion of the cover.

2. The electrical connection box according to claim 1, wherein
the case body includes a lower case, an upper case, and a case sealing member having elasticity;
the lower case and the upper case are configured to be assembled together;
the case sealing member is configured to come into close contact with the lower case and the upper case and form a watertight seal between the lower case and the upper case;
the branch circuit includes a lower branch circuit disposed in the lower case and an upper branch circuit disposed in the upper case;

the lower case includes at least one connector connected to the lower branch circuit;

the upper case includes at least one connector connected to the upper branch circuit; and the lower branch circuit and the upper branch circuit are disposed next to one another in a direction in which the lower case and the upper case are assembled together.

3. The electrical connection box according to claim 2, wherein the power supply circuit is disposed in the lower case; and the upper branch circuit includes a branch bus bar connected to the power supply circuit.

4. The electrical connection box according to claim 3, wherein the upper case includes an upper base where the overcurrent protection element of the upper branch circuit is disposed;

the lower case includes a lower base where the overcurrent protection element of the lower branch circuit is disposed; and the upper base and the lower base are disposed next to one another in the direction in which the lower case and the upper case are assembled together.

5. The electrical connection box according to claim 4, wherein the upper case includes a base receiving portion from which the upper base is able to be detached; and the base receiving portion includes a second working hole closed by the upper base.

6. The electrical connection box according to claim 5, wherein the branch bus bar is able to be connected to the power supply circuit via the first working hole and the second working hole.

7. An electrical connection box, comprising:

a case;

a power supply circuit; and a branch circuit, wherein the branch circuit is a circuit that includes a detachable overcurrent protection element and branches from the power supply circuit;

the case includes a case body, a cover detachably attached to the case body, and a cover sealing member having elasticity;

the case body includes a first working hole and houses the power supply circuit and the branch circuit;

the first working hole extends through a ceiling plate of the case body at a position that allows the overcurrent protection element to face outward and is formed with external shape dimensions smaller than external shape dimensions of the ceiling plate;

the cover is installed on the case body in a manner such that the first working hole is closed;

the cover sealing member is brought into close contact with a peripheral edge portion of the first working hole of the case body and the cover;

the case body includes a lower case, an upper case, and a case sealing member having elasticity;

the lower case and the upper case are configured to be assembled together;

the case sealing member is configured to come into close contact with the lower case and the upper case and form a watertight seal between the lower case and the upper case;

the branch circuit includes a lower branch circuit disposed in the lower case and an upper branch circuit disposed in the upper case;

the lower case includes at least one connector connected to the lower branch circuit;

the upper case includes at least one connector connected to the upper branch circuit; and the lower branch circuit and the upper branch circuit are disposed next to one another in a direction in which the lower case and the upper case are assembled together.

8. The electrical connection box according to claim 7, wherein the power supply circuit is disposed in the lower case; and the upper branch circuit includes a branch bus bar connected to the power supply circuit.

9. The electrical connection box according to claim 8, wherein the upper case includes an upper base where the overcurrent protection element of the upper branch circuit is disposed;

the lower case includes a lower base where the overcurrent protection element of the lower branch circuit is disposed; and the upper base and the lower base are disposed next to one another in the direction in which the lower case and the upper case are assembled together.

10. The electrical connection box according to claim 9, wherein the upper case includes a base receiving portion from which the upper base is able to be detached; and the base receiving portion includes a second working hole closed by the upper base.

11. The electrical connection box according to claim 10, wherein the branch bus bar is able to be connected to the power supply circuit via the first working hole and the second working hole.

* * * * *